(12) United States Patent
Stewart

(10) Patent No.: US 6,890,773 B1
(45) Date of Patent: May 10, 2005

(54) DYNAMIC MAINTENANCE OF MANUFACTURING SYSTEM COMPONENTS

(75) Inventor: Edward C. Stewart, Buda, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 77 days.

(21) Appl. No.: 10/126,860

(22) Filed: Apr. 19, 2002

(51) Int. Cl.[7] .......................... H01L 21/66; H01L 23/58; G06F 19/00
(52) U.S. Cl. .............. 438/14; 438/5; 438/18; 438/4; 438/17; 257/48; 257/E21.52; 702/97; 702/85; 702/108; 702/118; 700/100
(58) Field of Search .................... 438/14, 606, 689, 438/4, 495, 5, 17, 50, 53, 18, 460, 462, 514, 518, 522, 540, 509, 308, 600, 663, 8, 747, 94; 257/48, E21; 716/5; 700/100; 702/97, 85, 108, 118

(56) References Cited

U.S. PATENT DOCUMENTS 5,410,495 A * 4/1995 Ramamurthi ............... 702/100
6,161,054 A * 12/2000 Rosenthal et al. .......... 700/121
6,248,602 B1 * 6/2001 Bode et al. .................. 438/14
6,532,428 B1 * 3/2003 Toprac ......................... 702/97

* cited by examiner

*Primary Examiner*—Matthew Smith
*Assistant Examiner*—Igwe U. Anya
(74) *Attorney, Agent, or Firm*—Williams, Morgan & Amerson

(57) ABSTRACT

A method and an apparatus for sorting between actual and perceived errors related to processing of semiconductor wafers. A plurality of semiconductor wafers are processed. Fault data relating to the processed semiconductor wafers is acquired. A trend associated with the fault data is determined. A determination is made whether the fault data relates to an actual fault associated with the semiconductor wafers or to a calibration error, based upon the trend. A component is notified of the calibration error in response to the determination that the fault data relates to the calibration error.

37 Claims, 7 Drawing Sheets

DYNAMIC MAINTENANCE OF MANUFACTURING SYSTEM COMPONENTS

BACKGROUND OF THE INVENTION

1. Field of the Invention

This invention relates generally to semiconductor manufacturing, and, more particularly, to a method and apparatus for sorting between actual and perceived errors detected on semiconductor wafers.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a package semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed across a group of semiconductor wafers, sometimes referred to as a lot. For example, a process layer composed of variety of materials may be formed across a semiconductor wafer. Thereafter, a patterned layer of photoresist may be formed across the process layer using known photolithography techniques. Typically, an etch process is then performed across the process layer using the patterned layer of photoresist as a mask. This etching process results in the formulation of various features or objects in the process layer. Such features may be used for a gate electrode structure for transistors. Many times, trench isolation structures are also formed across the substrate of the semiconductor wafer to isolate electrical areas across a semiconductor wafer. One example of an isolation structure that can be used is a shallow trench isolation (STI) structure. Typically, forming trenches across the semiconductor wafer and filling such trenches with an insulating material, such as silicon dioxide, form STI structures across the semiconductor wafers.

The manufacturing tools within a semiconductor manufacturing facility typically communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a manufacturing process.

FIG. 1 illustrates a typical semiconductor wafer 105. The semiconductor wafer 105 typically includes a plurality of individual semiconductor die 103 arranged in a grid 150. Using known photolithography processes and equipment, a patterned layer of photoresist may be formed across one or more process layers that are to be patterned. As part of the photolithography process, an exposure process is typically performed by a stepper on approximately one to four die 103 locations at a time, depending on the specific photomask employed. The patterned photoresist layer can be used as a mask during etching processes, wet or dry, performed across the underlying layer or layers of material, e.g., a layer of polysilicon, metal or insulating material, to transfer the desired pattern to the underlying layer. The patterned layer of photoresist is comprised of a plurality of features, e.g., line-type features or opening-type features that are to be replicated in an underlying process layer.

Turning now to FIG. 2, a flow chart illustration of a prior art process flow is illustrated. A manufacturing system processes a lot/batch of semiconductor wafers 105 (block 210). The manufacturing system then generally acquires metrology data relating to the processed semiconductor wafers 105 (block 220). The manufacturing system may also acquire manufacturing environment sensor data, such as pressure sensor data, temperature sensor data, humidity sensor data, gas flow rate sensor data, and the like. Generally, the manufacturing system then analyzes the metrology data and/or the manufacturing environment sensor data to determine whether there are appreciable errors across the processed semiconductor wafers 105 (block 230).

The manufacturing system may then perform a feedback correction on processes performed on the semiconductor wafers 105 based upon the analysis of the metrology/manufacturing environment sensor data (block 240). One problem with the current methodology is that analysis of the metrology/manufacturing environment sensor data may cause the manufacturing system to perceive errors that may not actually exist. The state of the art does not offer an efficient process to distinguish between perceived errors and actual errors based upon analysis of the metrology/manufacturing environment sensor data.

As the manufacturing system continuously makes feedback corrections based upon the perceived error from the analysis of the metrology/manufacturing environment sensor data, the manufacturing system may cause operation of a processing tool to drift further from a normal range of operation. For example, if the error calculated from the metrology/manufacturing environment sensor data analysis are actually due to a drift in the processing tool or the metrology data acquisition tool, feedback correction based upon non-existent errors may be implemented by the manufacturing system. This may cause the operation of the processing tool or the metrology data acquisition tool to drift further from a desired range of operation. If the metrology data acquisition tool and/or the processing tool have drifts in their respective calibration points, real or perceived errors on the semiconductor wafers 105 may result. Simply executing a feedback correction generally may not correct the problem. Executing a feedback correction may in fact over-compensate the processes performed on the semiconductor wafer 105, thereby inducing errors across the processed semiconductor wafer 105.

The present invention is directed to overcoming, or at least reducing, the effects of, one or more of the problems set forth above.

SUMMARY OF THE INVENTION

In one aspect of the present invention, a method is provided for sorting between actual and perceived errors related to processing of semiconductor wafers. A plurality of semiconductor wafers are processed. Fault data relating to the processed semiconductor wafers is acquired. A trend associated with the fault data is determined. A determination is made whether the fault data relates to an actual fault associated with the semiconductor wafers or to a calibration error, based upon the tread. A component is notified of the calibration error in response to the determination that the fault data relates to the calibration error.

In another aspect of the present invention, a system is provided for sorting between actual and perceived errors related to processing of semiconductor wafers. The system of the present invention comprises: a processing tool to process a plurality of semiconductor wafers; and a process controller operatively coupled to the processing tool, the process controller to control an operation of the processing tool and perform an error-trend analysis, the error trend analysis comprising acquiring fault data and determining whether the fault data relates to at least one of an actual fault relating to the semiconductor wafers and a calibration error.

In another aspect of the present invention, an apparatus is provided for sorting between actual and perceived errors related to processing of semiconductor wafers. The apparatus of the present invention comprises a process controller being adapted to control an operation of a processing tool and perform an error-trend analysis, the error trend analysis comprising acquiring fault data and determining whether the fault data relates to at least one of an actual fault relating to processed semiconductor wafers and a calibration error.

In yet another aspect of the present invention, a computer readable program storage device encoded with instructions is provided for sorting between actual and perceived errors related to processing of semiconductor wafers. The computer readable program storage device encoded with instructions when executed by a computer: process a plurality of semiconductor wafers; acquires fault data relating to the processed semiconductor wafers; determines a trend associated with the fault data; determines whether the fault data relates to at least one of an actual fault associated with the semiconductor wafers and a calibration error, based upon the trend; and notifies a component of the calibration error in response to the determination that the fault data relates to the calibration error.

BRIEF DESCRIPTION OF THE DRAWINGS

The invention may be understood by reference to the following description taken in conjunction with the accompanying drawings, in which like reference numerals identify like elements, and in which.

Figure 1:
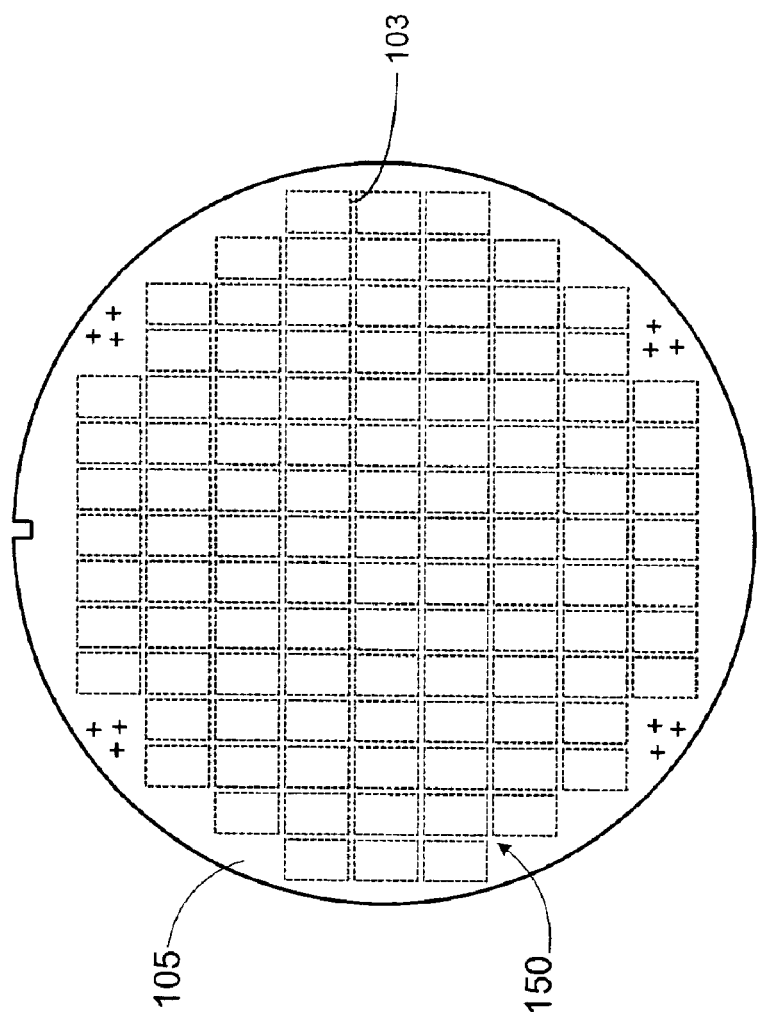
FIG. 1 is a simplified diagram of a prior art semiconductor wafer being processed.
Figure 2:
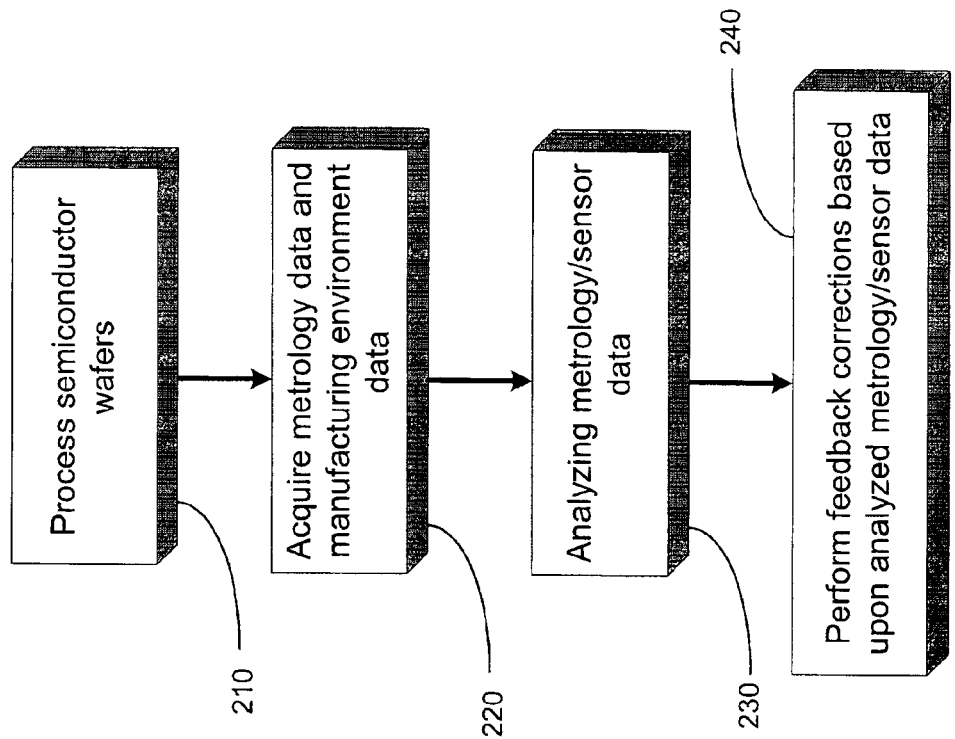
FIG. 2 illustrates a simplified flowchart depiction of a prior art process flow during manufacturing of semiconductor wafers.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. Deciphering between actual errors and perceived errors, which may be a result of miss-calibration of manufacturing components associated with a manufacturing system, is important is performing proper correction(s) to subsequent processes. Embodiments of the present invention provide for monitoring the health of a manufacturing component (e.g., a processing tool, a metrology data acquisition tool, a manufacturing environment sensor, and the like) in a manufacturing system, in order to discriminate between actual errors on a semiconductor wafer 105 and a component health error.

Embodiments of the present invention provide for discriminating between errors occurring on a processed semiconductor wafer 105 and a general trend relating to a drift in the operation of a component from an ideal operation point. Embodiments of the present invention provide for performing fault detection analysis on data relating to processed semiconductor wafers 105 and performing an error/trend sorting function to sort errors from processing trends to either perform normal feedback corrections or normalize the errors before performing feedback corrections. This may prevent over-compensation when performing feedback corrections.

Embodiments of the present invention provide for performing and/or scheduling calibration of particular manufacturing components in the manufacturing system to reduce the drifts in the operations of the components. Embodiments of the present invention also provide for analyzing device performance data and/or data relating to processed semiconductor wafers 105 to determine whether there are deviations in the operation of manufacturing components in the manufacturing system, which may be corrected by scheduling and performing calibration of the components.

Figure 3:
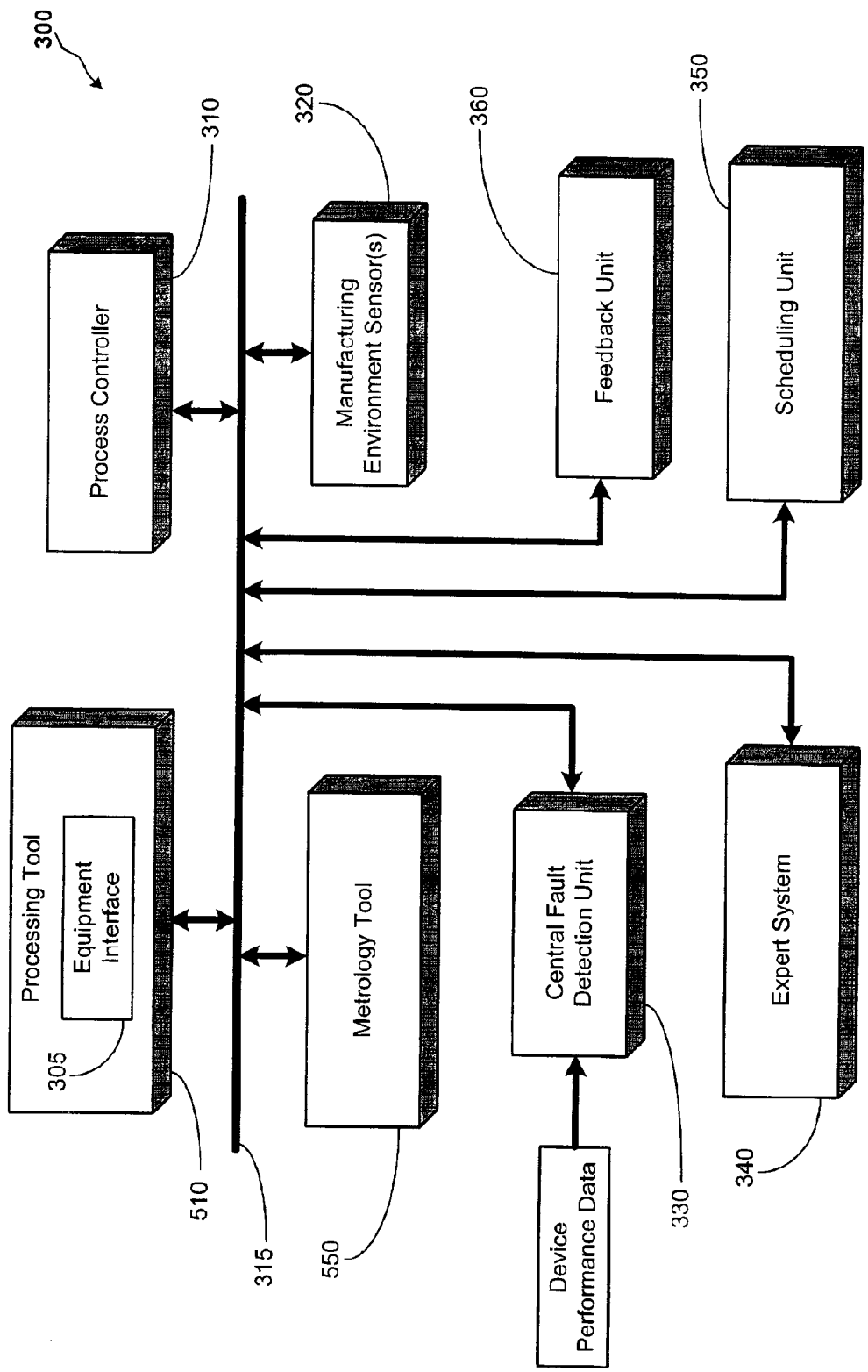
FIG. 3 is a block diagram representation of a system in accordance with one illustrative embodiment of the present invention.

Turning now to FIG. 3, a block diagram depiction of a system 300, in accordance with embodiments of the present invention, is illustrated. The system 300 comprises a processing tool 510, which is generally controlled by a process controller 310. In one embodiment, the process controller 310 may comprise an APC framework. The processing tool 510 may comprise an equipment interface 305. The equipment interface 305 is capable of communicating with the process controller 310. The process controller 310 is capable of sending control signals to control the operation of the processing tool 510 via the equipment interface 305.

The system 300 also comprises a metrology tool 550 capable of acquiring metrology data regarding processed semiconductor wafers 105 that have been processed by the processing tool 510. In one embodiment, metrology data may include data relating to a physical characteristic of a processed semiconductor wafer 105, data relating to an absence of a physical characteristic on a processed semiconductor wafer 105, data relating to non-physical characteristics of the semiconductor wafer 105, and the like. The system 300 also comprises one or more manufacturing environment sensors 320 that acquire manufacturing environment sensor data relating to the process performed on the semiconductor wafers 105. The manufacturing environment sensors 320 are generally associated with particular processing tools 510. The manufacturing environment sensors 320 may include a temperature sensor, a pressure sensor, a humidity sensor, a gas flow rate sensor, and the like. Analysis of the metrology data may indicate faults that may exist on the processed semiconductor wafers 105. Faults may also be detected based upon manufacturing environment sensor data. For example, a determination may be made that semiconductor wafers 105 were processed under an un-acceptable temperature pressure, and/or humidity, which may have resulted in semiconductor wafers 105 from which ineffectively operating devices may have been produced.

The system 300 may also comprise a central fault detection unit 330, an expert system 340, a scheduling unit 350, and a feedback unit 360, which may communicate with the processing tool 510 and the process controller 310 via a system communication link and/or a network connection 315. The system communications line 315 may be a computer bus link, a dedicated hardware communications link, a telephone system communications link, a wireless communications link, or other communication links that may be implemented by those skilled in the art having benefit of the present disclosure.

The central fault detection unit 330 is capable of performing fault detection upon a plurality of processed semiconductor wafers 105, which may be processed by one or more processing tools 510. The central fault detection unit 330 is also capable of analyzing faults detected from testing of devices produced from the processed semiconductor wafers 105. What constitutes a fault may be a function of predetermined threshold defined for particular types of processes performed on the semiconductor wafers 105. Based upon faults detected by the central fault detection unit 330, the expert system 340 may make a plurality of determinations regarding the fault detection data generated by the central fault detection unit 330. For example, the expert system 340 may determine the faults detected by the metrology tool 550 and the manufacturing environment sensors 320 may be related to actual faults on the semiconductor wafers 105, or the expert system 340 may determine that the detected fault may be part of a trend of faults, which may not reflect actual errors on the processed semiconductor wafers 105. The expert system 340 is capable of performing analysis on the fault detection data from a plurality of processing tools 510 and/or devices manufactured from the semiconductor wafers 105, and generating data relating to the condition of particular manufacturing components in a manufacturing fab.

When the expert system 340 determines that the fault detection data indicates that operations of a metrology tool 550, a manufacturing environment sensor 320, and/or a processing tool 510 may be drifting from normal operation modes, the scheduling unit 350 may invoke a calibration event for a particular manufacturing component of the system 300. The calibration event may include re-routing semiconductor wafers 105 to a manufacturing component, substantially reducing the normal operations of the component, and calibrating the component.

The scheduling unit 350 may analyze the manufacturing flow of semiconductor wafers 105 through one or more processing tool 510 and may determine an efficient time slot in which to perform calibration of a component in the system 300. Furthermore, based upon determinations of the expert system 340, the feedback unit 360 may perform a feedback correction based upon the fault detection data provided by the central fault detection unit 330. When the expert system 340 determines that the fault detection data may actually relate to actual faults on semiconductor wafers 105, the feedback unit 360 may calculate feedback adjustments to be made to the control parameters that control the processing tool 510 in order to reduce the faults caused on semiconductor wafers 105 during processing.

If the expert system 340 determines that the fault detection data includes a general trend relating to a drift from normal operations by a processing tool 510, the actual fault data may be normalized. Normalizing the fault data tends to reduce the magnitude of the fault data, such that more mild feedback corrections are made. For example, if large faults are detected on the line widths of particular structures formed on the semiconductor wafers 105, normalizing such measurements to indicate a more realistic fault analysis of the errors on the line width will allow the feedback unit 360 to appropriately, and mildly in this case, adjust feedback corrections to control parameters for subsequent processes performed by the processing tool 510. Normalizing the fault data may prevent over-correcting the operations of manufacturing components during feedback corrections. The feedback adjustments may be calculated and implemented by the process controller 310. The central fault detection unit 330, the expert system 340, the scheduling unit 350, and/or the feedback unit 360 may be software, hardware, and/or firmware units that may be stand alone units or units that are integrated into a computer system associated with the system 300.

Figure 4:
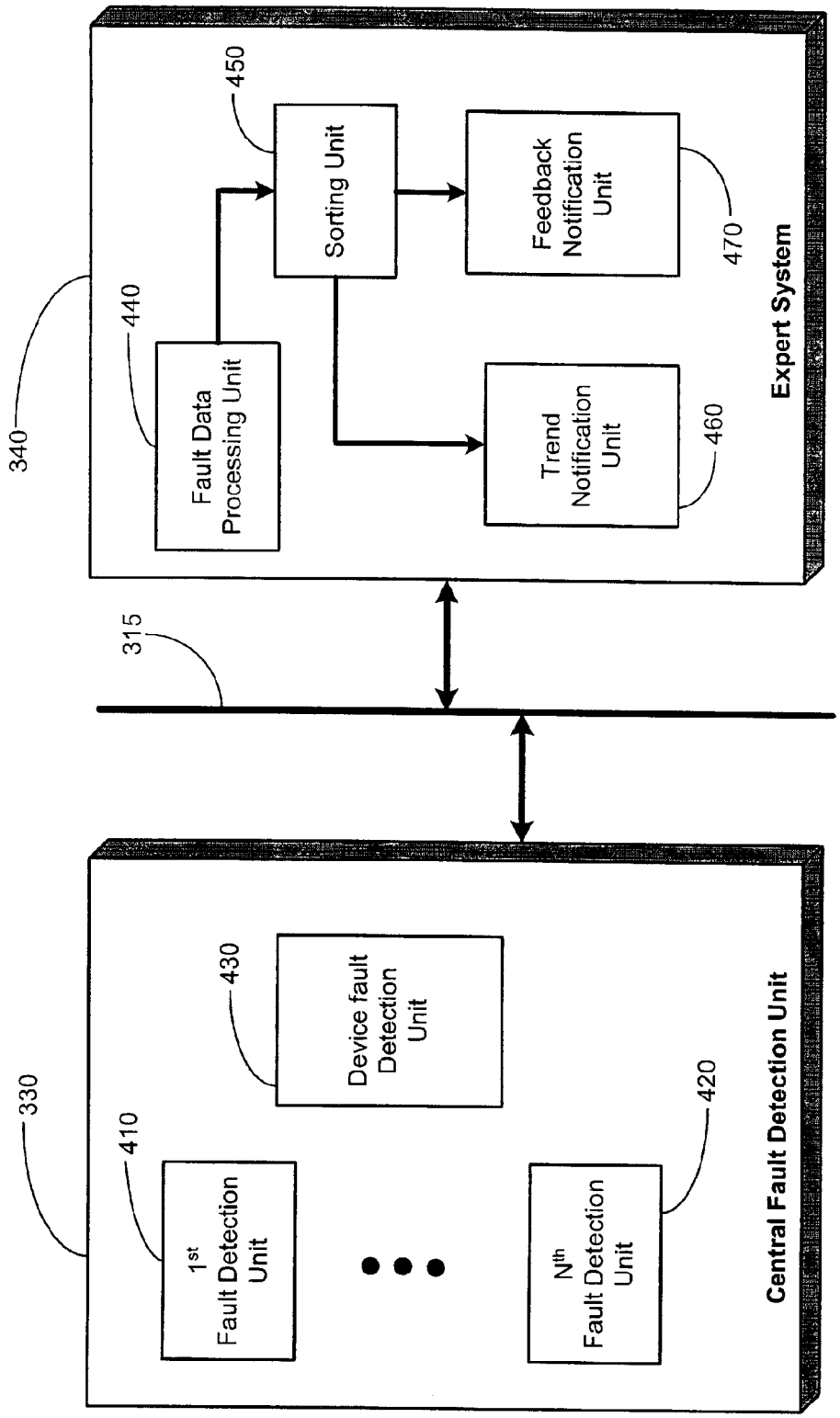
FIG. 4 is a more detailed block diagram representation of a central fault detection unit and an expert system of FIG. 3, in accordance with one illustrative embodiment of the present invention.

Turning now to FIG. 4, a more detailed block diagram depiction of the central fault detection unit 330 and the expert system 340 is illustrated. The central fault detection unit 330 may comprise a plurality of fault detection units, such as the first through $N^{th}$ fault detection units 410, 420. In one embodiment, each of the first through $N^{th}$ fault detection units 410, 420 may be associated with individual processing tools 510 and/or individual metrology tools 550. Therefore, the individual first through $N^{th}$ fault detection units 410, 420 may perform fault detection analysis independently based upon data received from their corresponding metrology tools 550 and/or manufacturing environment sensors 320. Each of the first through $N^{th}$ fault detection units 410, 420 may define a fault based on independent predetermined thresholds.

Furthermore, the central fault detection unit 330 may comprise a device fault detection unit 430. The device fault detection unit 430 is capable of receiving test data relating to devices manufactured from the processed semiconductor wafers 105, and performing a fault analysis on such data. Based upon the fault detection data/analysis from a plurality of processing tools 510, metrology tools 550, manufacturing environment sensors 320, and the device fault analysis, a general trend may be calculated by the central fault detection unit 330. The trend may indicate that the operation of one or more manufacturing components may be drifting from a normal range of operation. Comparisons between fault data of many manufacturing components in the system 300 may be performed in order to recognize trends or drifts from the normal operation relating to manufacturing components in the system 300. For example, critical dimensions for a particular transistor on processed semiconductor wafers 105 may initially appear to be substantially out of acceptable margins, until it is normalized based upon analysis of the fault detection data and/or the device fault data, which may indicate a trend of progressively increasing errors detected on the critical dimension measurements.

Upon normalizing the critical dimensions errors, the actual error may be small enough to be within an acceptable predetermined margin of error such that no substantial feedback corrections are required to continue the particular process. For example, a number of fault detection data sets relating to different semiconductor wafers 105 that went through particular processing tools 510 may now be analyzed so that variables (e.g., tool settings, types of processes, the process layer upon which the process was implemented, and the like) may be discovered and isolated, which may indicate that a particular component may be fault. For example, if a group of semiconductor wafers 105 exhibit particular errors, and half of them have gone through a different processing tool 510, a conclusion may be made that the errors may be related to a calibration error on a particular processing tool 510 and may not be an actual error on the semiconductor wafers 105, which may cause the normalizing of the data to reduce overreaction by the feedback system. Therefore, based upon an analysis of fault detection data from a plurality of fault detection units 410, 420, and/or the device fault detection unit 430, a determination may be made by the central fault detection unit 330 that that the fault detection data may be related to calibration problems that may exist on a particular metrology tool 550 or a processing tool 510. This conclusion is generally determined by the expert system 340.

The expert system 340 may comprise a fault data processing unit 440, a sorting unit 450, a trend notification unit 360, and a feedback notification unit 470. The fault data processing units 440 may perform much of the fault detection analysis and the discrimination between actual faults and perceived faults due to calibration problems. The sorting unit 450 generally sorts between actual errors on semiconductor wafers 105 and perceived errors due to calibration or other drifts in manufacturing components in the system 300.

When a trend of a drift of a particular component in the system 300 is recognized by the expert system 340, the trend notification unit 460 generally notifies the equipment interface 305 associated with a particular processing tool 510. The trend notification unit 460 may also notify particular metrology tools 550 that they may be miss-calibrated; the notification may also be sent to the process controller 310. Based upon signals from the trend notification unit 460, the scheduling unit 350 may schedule calibration of particular manufacturing components that may have shown a trend of drift away from normal operations. The expert system 340 also comprises the feedback notification unit 470 to notify the feedback unit 360 that feedback compensation for some faults that are detected may not be appropriate. The feedback notification unit 470 may provide normalization factors that may be used to normalize the magnitude of particular faults such that the feedback unit 360 may perform smaller adjustments to subsequent processing of a particular processing tool 510.

Figure 5:
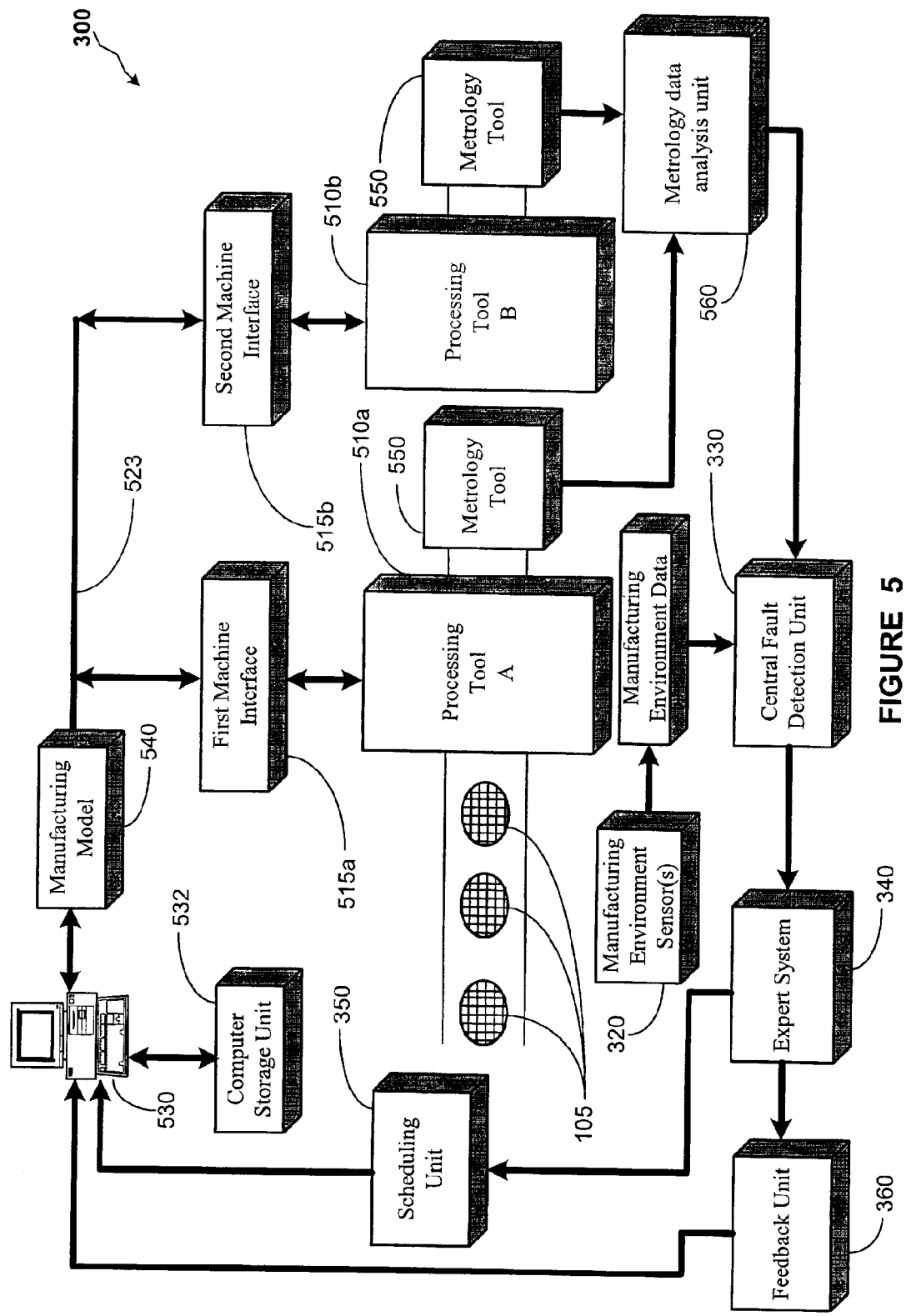
FIG. 5 illustrates a more detailed block diagram representation of the system shown in FIG. 3, in accordance with one illustrative embodiment of the present invention.

Turning now to FIG. 5, a more detailed block diagram of the system 300 in accordance with one embodiment of the present invention is illustrated. Semiconductor wafers 105 are processed on processing tools 510*a*, 510*b* using a plurality of control input signals, or manufacturing parameters, provided via a line or network 523. The control input signals, or manufacturing parameters, on the line 523 are sent to the process tools 510*a*, 510*b* from a computer system 530 via machine interfaces 515*a*, 515*b*. The first and second machine interfaces 515*a*, 515*b* are generally located outside the processing tools 510*a*, 510*b*. In an alternative embodiment, the first and second machine interfaces 515*a*, 515*b* are located within the processing tools 510*a*, 510*b*. The semiconductor wafers 105 are provided to an carried from a plurality of processing tools 510. In one embodiment, semiconductor wafers 105 may be provided to a processing tool 510 manually. In an alternative embodiment, semiconductor wafers 105 may be provided to processing tool 510 in an automatic fashion (e.g., robotic movement of semiconductor wafer 105). In one embodiment, a plurality of semiconductor wafers 105 is transported in lots (e.g., stacked in cassettes) to the processing tools 510.

In one embodiment, the computer system 530 sends control input signals, or manufacturing parameters, on the line 523 to the first and second machine interfaces 515*a*, 515*b*. The computer system 530 is capable of controlling processing operations. In one embodiment, the computer system 530 is a process controller. The computer system 530 is coupled to a computer storage unit 532 that may contain a plurality of software programs and data sets. The computer system 530 may contain one or more processors (not shown) that are capable of performing the operations described herein. The computer system 530 employs a manufacturing model 540 to generate control input signals on the line 523. In one embodiment, the manufacturing model 540 contains a manufacturing recipe that determines a plurality of control input parameters that are sent on the line 523 to the processing tools 510*a*, 510*b*.

In one embodiment, the manufacturing model 540 defines a process script and input control that implement a particular manufacturing process. The control input signals (or control input parameters) on the line 523 that are intended for processing tool A 510*a* are received and processed by the first machine interface 515*a*. The control input signals on the line 523 that are intended for processing tool B 510*b* are received and processed by the second machine interface 515*b*. Examples of the processing tools 510*a*, 510*b* used in semiconductor manufacturing processes are steppers, etch process tools, deposition tools, and the like.

One or more of the semiconductor wafers 105 that are processed by the processing tools 510*a*, 510*b* can also be sent to a metrology tool 550 for acquisition of metrology data. The metrology tool 550 may be a scatterometry data acquisition tool, an overlay-error measurement tool, a critical dimension measurement tool, and the like. In one embodiment, a metrology tool 550 examines one or more processed semiconductor wafers 105. The metrology data analysis unit 560 may collect, organize, and analyze data from the metrology tool 550. The metrology data is directed to a variety of physical or electrical characteristics of the devices formed across the semiconductor wafers 105. For example, metrology data may be obtained as to line width measurements, depth of trenches, sidewall angles, thickness, resistance, and the like. Metrology data may be used to determine faults that may be present across the processed semiconductor wafers 105.

The central fault detection unit 330 may receive data from the manufacturing environment sensors 320 and metrology data from the metrology data analysis unit 560. As described above, the central fault detection unit 330 then provides fault detection data to the expert system 340 for analysis and sorting of actual errors and trends that may be caused by calibration or drift problems. The scheduling unit 350 then provides data to the computer system 530 to schedule a calibration of a particular processing tool 510 or other manufacturing components associated with the system 300. Furthermore, the expert system 340 provides data to the feedback unit 360, which may be used to perform appropriate feedback corrections based upon the sorting of the actual errors and trends relating to drifts/miss-calibration of particular manufacturing components associated with the system 300.

Figure 6:
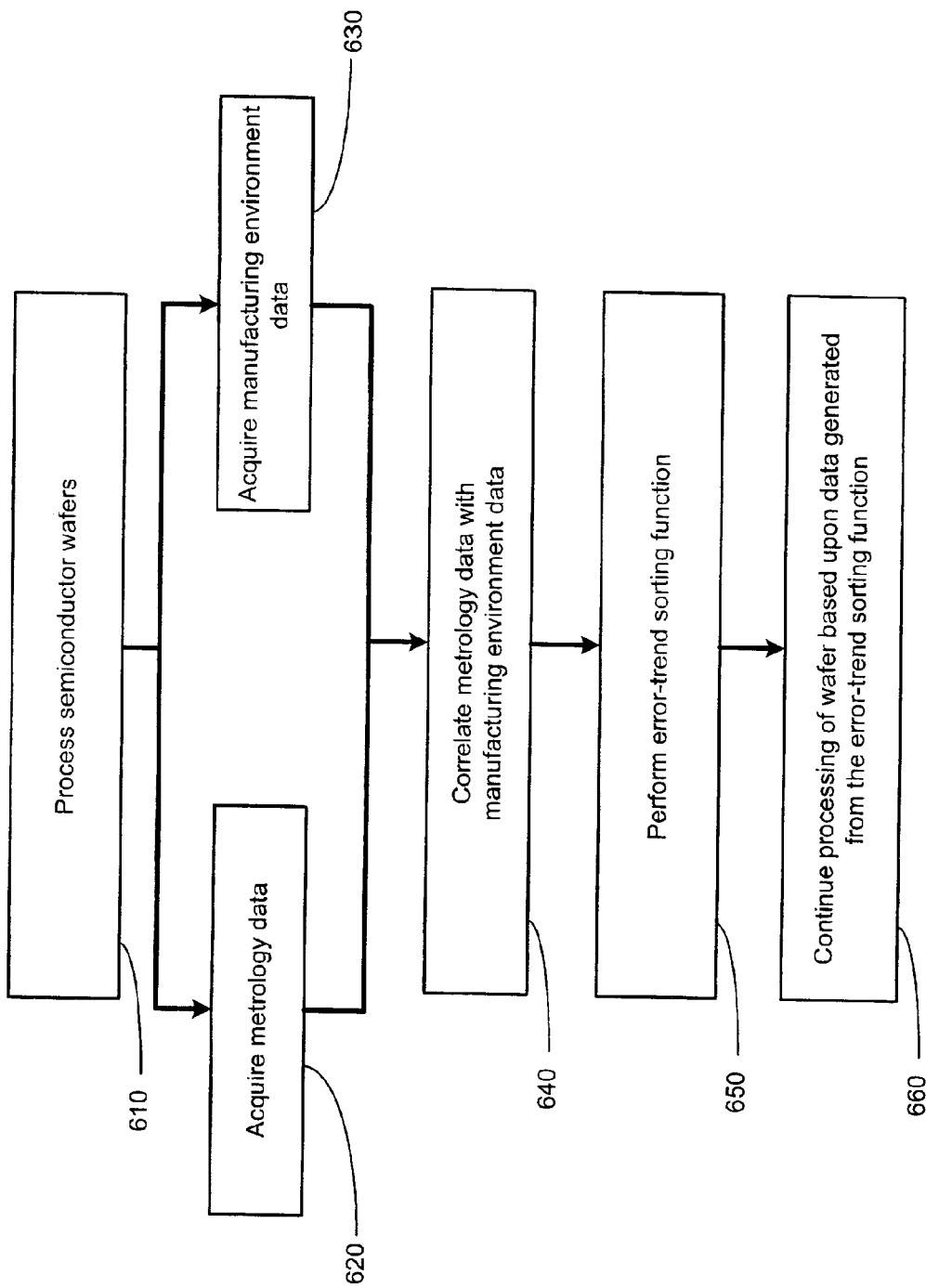
FIG. 6 illustrates a flowchart depiction of a method in accordance with one illustrative embodiment of the present invention.

Turning now to FIG. 6, a flow chart depiction of the methods associated with embodiments of the present invention is illustrated. The system 300 processes a plurality of semiconductor wafers 105 (block 610). Upon processing of semiconductor wafers 105, the system 300 may acquire metrology data associated with the processed semiconductor wafers 105 (block 620). The system 300 may also acquire manufacturing environment sensor data relating to the processing tool 510 during the processing of the semiconductor wafers 105 (block 630). The manufacturing environment sensor data may include temperature data, humidity data, gas flow rate data, pressure data, and the like. The system 300 may then correlate the metrology data with the particular manufacturing environment sensor data to provide the data for fault detection analysis (block 640). The system 300 then performs an error-trend sorting function, which is used to sort actual errors on the processed semiconductor wafers 105 and separate them from trends that reflect drifts or miss-calibration of manufacturing components associated with the system 300 (block 650). A more detailed flowchart illustration of the steps relating to the errors/trend sorting function indicated in block 650 of FIG. 6, is provided in FIG. 7 and accompanying description below.

Upon performing the error-trend sorting function, particular errors may be discounted, calibrations of particular manufacturing components may be performed, and processing of the semiconductor wafers 105 is continued (block 660). The continuation of the processing may be performed with either normal feedback corrections and/or by feedback corrections based upon normalized errors. Upon performing the steps of FIG. 6, overreaction to particular faults detected may be reduced and calibration of manufacturing components associated with the system 300 may be scheduled to provide for more accurate processing of semiconductor wafers 105.

Figure 7:
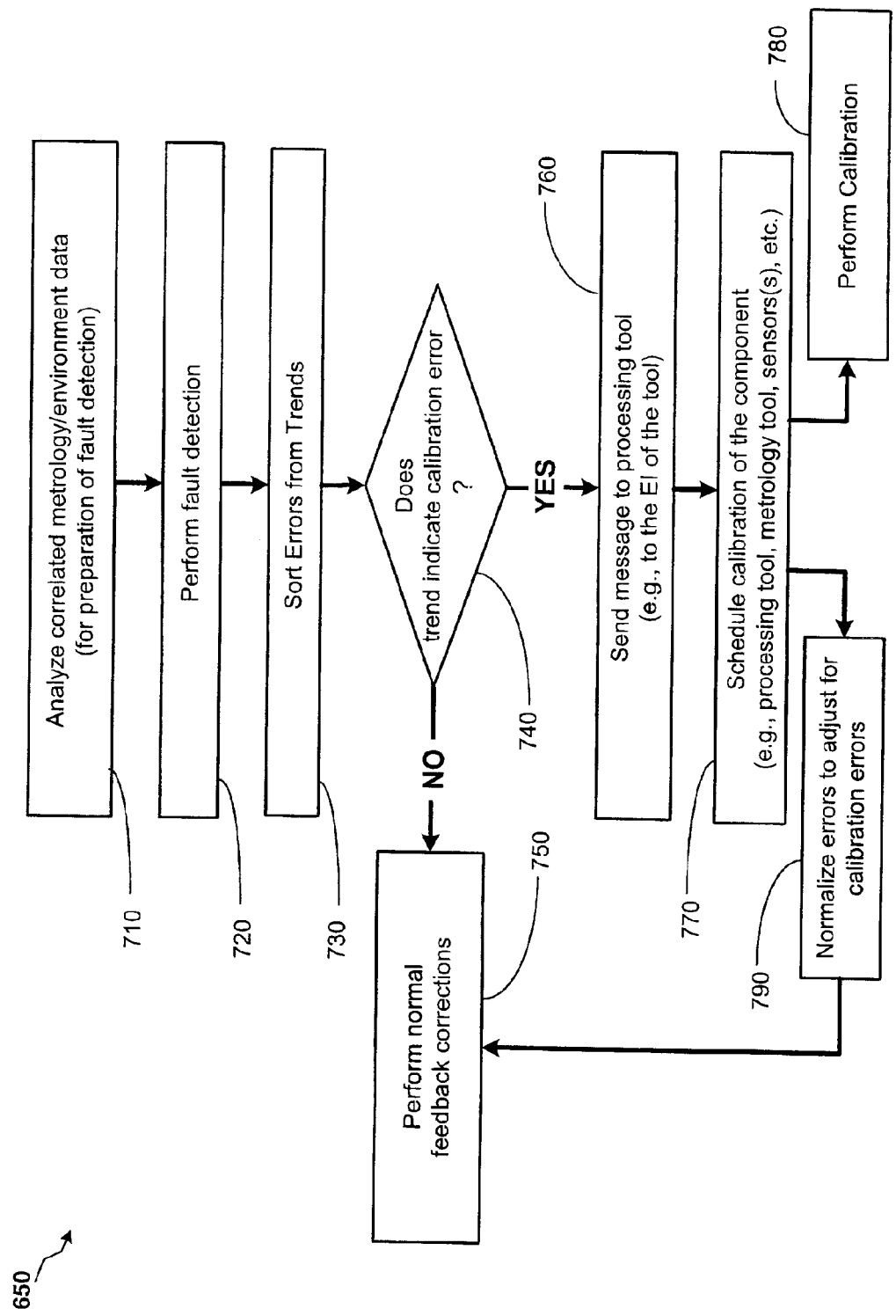
FIG. 7 illustrates a flowchart depiction of a method of performing an error-trend sorting function, as indicated in FIG. 6, in accordance with one illustrative embodiment of the present invention.

Turning now to FIG. 7, a flowchart depiction of a more detail illustration of the steps for performing the error-trend sorting function indicated in block 650 of FIG. 6 is provided. Upon receiving correlated metrology/manufacturing environment sensor data, the system 300 analyzes the correlated metrology/manufacturing environment sensor data in order to perform fault detection (block 710). The system 300 then performs fault detection based upon the analysis of the correlated metrology/manufacturing environment sensor data (block 720). In one embodiment, the metrology tool 550 acquires the metrology data and the manufacturing environment sensors 320 acquire the manufacturing environment sensor data. The central fault detection unit 330 performs the fault detection. The system 300 then sorts actual errors from apparent errors, which may be indicated by trends that may point toward a possibility that the operation of the metrology tool 550 or the processing tool 510 may be drifting from the operating norms (block 730). In other words, the metrology tool 550 and/or the processing tool 510 may be in need of calibration.

The system 300 makes a determination whether the trends indicate a calibration error (block 740). In one embodiment, the expert system 340, based upon the sorting unit 450 in the expert system 340, makes a determination whether the trend detected from the data indicates a calibration error. Generally, if process results indicate that faults on processed semiconductor wafers 105 are progressively getting worse despite attempts at feedback corrections, a determination may be made that the fault data indicates an apparent error and not an actual error. Upon a determination that the trends do not indicate a calibration error, the system 300 performs normal feedback corrections based upon the faults detected (block 750). The feedback unit 360, which may prompt the process controller 310 to modify one or more control parameters that control the operation of the processing tool 510, may perform the feedback corrections.

When the system 300 determines that the trends detected in the fault data indicate a calibration error, the system 300 provides a message to the processing tool 510 regarding the calibration error (block 760). The trend notification unit 460 in the expert system 340 may provide such an indication to the equipment interface 305 of the processing tool 510, to a metrology tool 550, or to a manufacturing environment sensor 320. Furthermore, the system 300 schedules a calibration event in order to correct or reduce the effect of the drift due to the miss-calibration of a manufacturing component associated with the system 300 (block 770). The scheduling of the calibration event may comprise re-routing flow of semiconductor wafers 105, substantially reducing normal operation of a manufacturing component, and/or calibrating the component.

Once a calibration event is scheduled, the system 300 then performs an actual calibration of the processing tool 510, the metrology tool 550, the manufacturing environment sensor (s) 320, and/or another manufacturing component (block 780). Furthermore, the system 300 may normalize errors to adjust for calibration errors and provide such data for appropriate feedback corrections (block 790). Upon normalizing the errors to compensate for the calibration errors, the system 300 may then perform normal feedback operations 750, which consist of performing smaller adjustments (i.e., adjustments of smaller magnitude) to the operation of the processing tool 510. The completion of the steps provided in FIG. 7 substantially completes the error-trend sorting function indicated in block 650 of FIG. 6.

By implementing methods, apparatus, and/or systems provided by the present invention, the probability of overrating to detected errors, which may be perceived errors that may not reflect actual errors detected on the processed semiconductor wafers 105 and/or on the devices manufactured from the processed semiconductor wafers 105, may be reduced. Using embodiments of the present invention, more appropriate feedback correction, which may be a scaled-down feedback correction, is promoted. Furthermore, miss-calibration of the various manufacturing components of the system 300 may be detected such that a calibration is scheduled and performed on the manufacturing components. Utilizing embodiments of the present invention, appropriate scheduling of various manufacturing component associated with the system 300 may be scheduled with minimal interruption of the process flow yet may result in more accurate processing of semiconductor wafers 105 due to appropriate calibration of the manufacturing components.

The principles taught by the present invention can be implemented in an Advanced Process Control (APC) Framework, such as a Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699- Provisional Specification for CIM Framework Domain Architecture) and APC (SEMI E93-0999- Provisional Specification for CIM Framework Advanced Process Control Component) specifications are publicly available from SEMI. The APC is a preferred platform from which to implement the control strategy taught by the present invention. In some embodiments, the APC can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require of a number of software components. In addition to components with the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equipment manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   processing a plurality of semiconductor wafers;
   acquiring fault data relating to said processed semiconductor wafers;
   determining a trend associated with said fault data;
   determining whether said fault data relates to at least one of an actual fault associated with said semiconductor wafers and a calibration error, based upon said trend; and
   notifying a component of said calibration error in response to said determination that said fault data relates to said calibration error.

2. The method described in claim 1, further comprising scheduling a calibration event based upon notifying said component of said calibration error for calibrating a device associated with the processing said semiconductor wafers for processing additional semiconductor wafers.

3. The method described in claim 1, further comprising performing a feedback process based upon said determination that said fault data relates to said actual fault associated with said semiconductor wafer.

4. The method described in claim 1, further comprising normalizing said fault data based upon said determination that said fault data relates to said calibration error.

5. The method described in claim 4, further comprising performing a feedback process based upon said normalized fault data.

6. The method described in claim 1, wherein acquiring said fault data relating to said processed semiconductor wafers further comprises acquiring at least one of a metrology data relating to said processed semiconductor wafers, and a manufacturing environment sensor data relating to said processing of said semiconductor wafers.

7. The method described in claim 6, wherein acquiring the manufacturing environment sensor data further comprises acquiring at least one of a temperature data, a humidity data, a gas flow rate data, and a pressure data.

8. The method described in claim 1, wherein determining a trend associated with said fault data further comprises determining whether faults calculated from said fault data are progressively larger.

9. The method described in claim 8, wherein determining whether said fault data relates to at least one of an actual fault associated with said semiconductor wafers and a calibration error further comprises determining that said fault data relates to a calibration error in response to said determination that said faults calculated from said fault data is progressively larger.

10. The method described in claim 1, wherein determining whether said fault data relates to at least one of an actual fault associated with said semiconductor wafers and a calibration error further comprises sorting said fault data into an actual fault data and a perceived fault data relating to a calibration error.

11. The method described in claim 1, wherein notifying a component of said calibration error in response to said determination that said fault data relates said calibration error further comprises notifying at least one of a processing tool, a metrology tool, and a manufacturing environment sensor, of said calibration error.

12. A method, comprising
   processing a plurality of semiconductor wafers;
   acquiring at lest one of a metrology data relating to said processed semiconductor wafers and a manufacturing environment sensor data relating to said processing of said semiconductor wafers;
   calculating fault data relating to said processed semiconductor wafers based upon at least one of a metrology data relating to said processed semiconductor wafer and a manufacturing environment sensor data relating to said processing of said semiconductor wafers;
   determining a trend associated with said fault data;
   determining whether said fault data relates to at least one of an actual fault associated with said semiconductor wafers and a calibration error, based upon said trend;

notifying a component of said calibration error in response to said determination that said fault data relates to said calibration error; and scheduling a calibration event based upon notifying said component of said calibration error.

13. The method described in claim 12, further comprising performing a feedback process based upon said determination that said fault data relates to said actual fault associated with said semiconductor wafers.

14. The method described in claim 12, further comprising normalizing said fault data based upon said determination that said fault data relates to said calibration error.

15. The method described in claim 14, further comprising performing a feedback process based upon said normalized fault data.

16. The method described in claim 12, wherein determining a trend associated with said fault data further comprises determining whether faults calculated from said fault data are progressively larger.

17. An apparatus, comprising:

means for processing a plurality of semiconductor wafers;

means for acquiring fault data relating to said processed semiconductor wafers;

means for determining a trend associated with said fault data;

means for determining whether said fault data relates to at least one of an actual fault associated with said semiconductor wafers and a calibration error, based upon said tread; and means for notifying a component of said calibration error in response to said determination that said fault data relates to said calibration error.

18. A system, comprising:

a processing tool to process a plurality of semiconductor wafers; and a processing controller operatively coupled to said processing tool, said processing controller to control an operation of said processing tool and perform an error-trend analysis, said error-trend analysis comprising acquiring fault data and determining whether said fault data relates to at least one of an actual fault relating to said semiconductor wafers and a calibration error based, upon a trend associated with said fault data.

19. The system of claim 18, further comprising:

a central fault detection unit operatively coupled to said process controller unit to perform fault detection relating to said semiconductor wafers to acquire said fault data;

an expert system operatively coupled to said central fault detection unit, said expert system to perform analysis of said fault data to determine whether a trend associated with said fault data exists; and a scheduling unit operatively coupled to said expert system, said scheduling unit to schedule a calibration event based upon said trend associated with said fault data.

20. The system of claim 19, wherein said processing tool further comprises an equipment interface to receive a notification of said calibration event.

21. The system of claim 19, wherein said central fault detection unit further comprises a device fault detection unit to receive fault data relating to at least one device manufactured from said processed semiconductor wafers.

22. The system of claim 19, wherein said expert system further comprises:

a fault data processing unit to process said fault data from said central fault detection unit;

a sorting unit operatively coupled to said fault data processing unit, said sorting unit to sort at least one of an actual fault associated with said semiconductor wafers and a calibration error from said fault data;

a trend notification unit operatively coupled to said sorting unit, said trend notification unit to provide a calibration error notification to said processing tool; and a feedback modification unit operatively coupled to said sorting unit, said feedback modification unit to normalize said fault data for performing a feedback correction during a subsequent operation of said processing tool.

23. The system of claim 19, further comprising:

a computer system;

a manufacturing model operatively coupled with said computer system, said manufacturing model to generate and modify at least one control input parameter signal to control processing of said wafer;

a machine interface operatively coupled with said manufacturing model and said processing tool, said machine interface being capable of receiving process recipes from said manufacturing model;

a metrology tool operatively coupled with said processing tool, said metrology tool to acquire said metrology data relating to said semiconductor wafers;

a manufacturing environment sensor operatively coupled with said processing tool, said manufacturing environment sensor to acquire said manufacturing environment sensor data relating to processing of said semiconductor wafers; and a feedback unit operatively coupled to said process controller, said feedback unit to provide feedback correction to a subsequent operation of said processing tool.

24. The system of claim 23, wherein said computer system is capable of generating modification data for modifying at least one control input associated with an operation of said processing tool.

25. An apparatus, comprising:

a process controller being adapted to control an operation of a processing tool and perform an error-trend analysis, said error-trend analysis comprising acquiring fault data and determining whether said fault data relates to at least one of an actual fault relating to processed semiconductor wafers and a calibration error based upon a trend associated with said fault data.

26. The apparatus of claim 25, wherein said process controller further comprising:

a central fault detection unit operatively coupled to said process controller unit to perform fault detection relating to said semiconductor wafers to acquire said fault data;

an expert system operatively coupled to said central fault detection unit, said expert system to perform analysis of said fault data to determine whether a trend associated with said fault data exists;

a scheduling unit operatively coupled to said expert system, said scheduling unit to schedule a calibration event based upon said trend associated with said fault data; and a feedback unit operatively coupled to said expert system, said feedback unit to modify at least one control input parameter of an operation of said processing tool.

27. The apparatus of claim 26, wherein said expert system further comprises:

a fault data processing unit to process said fault data from said central fault detection unit;

a sorting unit operatively coupled to said fault data processing unit, said sorting unit to sort at least one of an actual fault associated with said semiconductor wafers and a calibration error from said fault data;

a trend notification unit operatively coupled to said sorting unit, said trend notification unit to provide a calibration error notification to said processing tool; and a feedback modification unit operatively coupled to said sorting unit, said feedback modification unit to normalize said fault data for performing a feedback correction during a subsequent operation of said processing tool.

28. A computer readable program storage device encoded with instructions that, when executed by a computer, performs a method, comprising:

processing a plurality of semiconductor wafers;

acquiring fault data relating to said processed semiconductor wafers;

determining a trend associated with said fault data;

determining whether said fault data relates to at least one of an actual fault associated with said semiconductor wafers and a calibration error, based upon said trend; and notifying a component of said calibration error in response to said determination that said fault data relates to said calibration error.

29. The computer readable program storage device encoded with instructions that, when executed by a computer, performs the method described in claim 28, the method further comprising scheduling a calibration event based upon notifying said component of said calibrations error.

30. The computer readable program storage device encoded with instructions that, when executed by a computer, perform the method described in claim 28, the method further comprising performing a feedback process based upon said determination that said fault data relates to said actual fault associated with said semiconductor wafers.

31. The computer readable program storage device encoded with instructions that, when executed by a computer, performs the method described in claim 28, the method further comprising normalizing said fault data based upon said determination that said fault data relates to said calibration error.

32. The computer readable program storage device encoded with instructions that, when executed by a computer, performs the method described in claim 31, further comprising performing a feedback process based upon said normalized fault data.

33. The computer readable program storage device encoded with instructions that, when executed by a computer, performs the method described in claim 28, wherein acquiring said fault data relating to said processed semiconductor wafers further comprises acquiring at least one of a metrology data relating to said processed semiconductor wafers, and a manufacturing environment sensor data relating to said processing of said semiconductor wafers.

34. The computer readable program storage device encoded with instructions that, when executed by a computer, performs the method descried in claim 28, wherein determining a trend associated with said fault data further comprises determining whether faults calculated from said fault data are progressively larger.

35. The computer readable program storage device encoded with instructions that, when executed by a computer, performs the method described in claim 34, wherein determining whether said fault data relates to at least one of an actual fault associated with said semiconductor wafers and a calibration error further comprises determining that said fault data relates to a calibration error in response to said determination that said faults calculated from said fault data are progressively larger.

36. The computer readable program storage device encoded with instructions that, when executed by a computer, performs the method described in claim 28, wherein determining whether said fault data relates to at least one of an actual fault associated with said semiconductor wafers and a calibration error further comprises sorting said fault data into an actual fault data and a perceived fault data relating to a calibration error.

37. The computer readable program storage device encoded with instructions that, when executed by a computer, performs the method described in claim 28, wherein notifying a component of said calibration error in response to said determination that said fault data relates to said calibration error further comprises notifying at least one of a processing tool, a metrology tool, and a manufacturing environment sensor, of said calibration error.

* * * * *